(12) United States Patent
Gauthier et al.

(10) Patent No.: US 6,842,351 B2
(45) Date of Patent: Jan. 11, 2005

(54) METHOD AND APPARATUS FOR I/O RESONANCE COMPENSATION

(75) Inventors: Claude R. Gauthier, Cupertino, CA (US); Aninda K. Roy, San Jose, CA (US); Brian W. Amick, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 62 days.

(21) Appl. No.: 10/370,901

(22) Filed: Feb. 20, 2003

(65) Prior Publication Data

US 2004/0165406 A1 Aug. 26, 2004

(51) Int. Cl.$^7$ .............................................. H00M 1/14
(52) U.S. Cl. ...................................................... 363/39
(58) Field of Search ................. 363/39, 50; 327/538, 327/549, 551; 323/299, 303; 361/54, 56, 111

(56) References Cited

U.S. PATENT DOCUMENTS

| | | | | |
|---|---|---|---|---|
| 4,215,298 A | * | 7/1980 | Bigley et al. | ................ 388/820 |
| 4,731,588 A | * | 3/1988 | Addis et al. | ................ 330/254 |
| 6,384,671 B1 | * | 5/2002 | Taguchi et al. | ............. 327/541 |
| 2004/0076025 A1 | * | 4/2004 | Gauthier et al. | .............. 363/50 |

* cited by examiner

*Primary Examiner*—Adolf Berhane
(74) *Attorney, Agent, or Firm*—Osha & May L.L.P.

(57) ABSTRACT

A computer system uses a power distribution network arranged to propagate at least one voltage potential to an integrated circuit. A resonance detector is arranged to detect a power supply resonance. A damping circuit is operatively connected to the resonance detector and the power distribution network. The damping circuit resides external to the integrated circuit and dampens the power supply resonance under control of the resonance detector.

20 Claims, 11 Drawing Sheets

METHOD AND APPARATUS FOR I/O RESONANCE COMPENSATION

BACKGROUND OF INVENTION

Power supplied to an integrated circuit (IC) occurs through a power distribution network. The power distribution network starts with a power supply that generates an appropriate DC voltage. The power supplied to the IC must traverse from the power supply across the power distribution network before the power reaches the IC. The power distribution network has characteristics that may affect the operation of the IC.

FIG. 1 shows a conventional printed circuit board system (10). The printed circuit board system (10) includes a printed circuit board (PCB) (12). The PCB (12) is a central platform on which various components are mounted. The PCB (12) has multiple layers that contain traces that connect the power supply and signals to the various components mounted on the PCB (12). Two layers, a system power supply layer (14) and a system ground layer (16), are shown in FIG. 1.

The system power supply layer (14) and the system ground layer (16) provide power to an IC (20). The power supplied to the IC (20) traverses the system power supply layer (14) and the system ground layer (16) from a DC source (not shown) to a package (18) on which the IC (20) is mounted. Other components are also mounted on the PCB (12) that generally attempt to maintain a constant voltage supplied to the IC (20). These components may include, but are not limited to, an air-core inductor (24), a power supply regulating integrated circuit (26), switching transistors (28), a tantalum capacitor (30), and electrolytic capacitors (32).

A variety of different types and different locations of capacitors are used to help maintain a constant voltage supplied to the IC (20). Electrolytic capacitors (32) mounted on the PCB (12) connect between the system power supply layer (14) and the system ground layer (16). The package (18), similar to the PCB (12), may include multiple planes and interconnections between the planes to provide a connective substrate in which power and data signals traverse. Ceramic capacitors (22) mounted on the package (18) connect between a package power supply signal (not shown) and a package ground signal (not shown).

Due to active switching of circuit elements on the IC (20), the power required by the IC (20) changes. The active switching causes power supply noise. Additional components may be included to minimize such power supply noise. For example, ceramic capacitors (22) near the IC (20) act as local power supplies by storing and dissipating charge as needed.

The addition of components reduces the power supply impedance at most frequencies; however, localized impedance peaks may exist. The impedance peaks indicate a power supply resonance. The power supply resonance is formed when parasitics in the power distribution network and components connected to the power distribution network are excited at a particular frequency. The parasitics include the inherent inductance, resistance, and capacitance that may exist in the IC (20) (or other integrated circuits), the package (18), and the power distribution network. In particular, the power supply resonance may be formed from the power distribution network and a "parasitic tank circuit" that includes the IC capacitance and package inductance.

FIG. 2 shows a schematic of a power distribution network for a package (296). The power distribution network is represented by impedances $Z_1$ (204), $Z_2$ (206), and $Z_3$ (208). Each of these impedances (204, 206, 208) may include resistive, inductive, and/or capacitive elements. Two power supply lines (292, 294) supply power to the package (296) located between the two power supply lines (292, 294). The impedances (204, 206, 208) model both the inherent parasitics of the power distribution network and added components.

On the package (296), various forms of capacitance may be used to further stabilize the power supply. Low equivalent series resistance (ESR) local decoupling capacitors are modeled by resistor (262) and capacitor (264). High ESR global decoupling capacitors are modeled by resistor (266) and capacitor (268). Non-switching logic disposed on an IC in the package (296) is modeled by resistor (270) and capacitors (272, 274). Switching logic disposed on the IC in the package (296) is modeled by variable resistors (276, 278) and capacitors (280, 282).

In FIG. 2, the schematic of the power distribution network may be used to simulate the power supply impedance observed by the IC in the package (296), as represented by "Z." To measure the power supply impedance, a 1 Ampere AC current source (290) injects current onto power supply line (292). The measured voltage, $V_M$, between the two power supply lines (292, 294) may be used to calculate the power supply impedance. The impedance Z is equal to $V_M$ divided by the 1 Ampere AC current source (290). By varying the frequency of the 1 Ampere AC current source (290), a frequency versus impedance relationship may be determined.

A representative graph of power supply impedance is shown in FIG. 3. Over a particular range of frequencies for the switching logic on the IC (296), the power supply impedance increases because the circuit formed by an IC and a package resonates. A spike in a power supply impedance curve (302), or a power supply resonance frequency, has the effect of current-starving the IC in the package (296 in FIG. 2). When the IC is current-starved, some voltage potentials on the IC in the package (296 in FIG. 2) may shift from their desired values. Accordingly, an increase in the power supply impedance may cause undesired operation of the IC in the package (296 in FIG. 2).

SUMMARY OF INVENTION

According to one aspect of the present invention, a power supply resonance compensation system comprising a power distribution network arranged to propagate from a power supply at least one voltage potential to an integrated circuit; a resonance detector operatively connected to the at least one voltage potential and arranged to detect power supply resonance; and a damping circuit external to the integrated circuit operatively connected to the resonance detector and the power distribution network where the damping circuit is arranged to dampen the power supply resonance under control of the resonance detector.

According to one aspect of the present invention, a method for reducing power supply resonance comprising propagating at least one voltage potential from a power supply to an integrated circuit; transmitting data to a receiving circuit from the integrated circuit; detecting whether a particular level of power supply resonance exists; and damping the power supply resonance dependent on the detecting where the damping occurs external to the integrated circuit.

According to one aspect of the present invention, an apparatus for reducing power supply resonance comprising power distribution means for propagating power to an integrated circuit; means for detecting power supply resonance on the power distribution means; and means for damping power supply resonance under control of the means for detecting where the means for damping resides external to the integrated circuit.

Other aspects and advantages of the invention will be apparent from the following description and the appended claims.

DETAILED DESCRIPTION

Embodiments of the present invention relate to a method for reducing power supply resonance.

Conventional approaches have focused on the clock frequency's relationship to the power supply resonance frequency. Much of the switching logic will operate at the clock frequency. So if the clock frequency closely matches the power supply resonance frequency of the power distribution network, power supply resonance can be observed. However, even if the clock frequency is significantly different than the power supply resonance frequency, certain patterns of transmitted bits may occur at the power supply resonance frequency, causing power supply resonance effects in a system.

Figure 4:
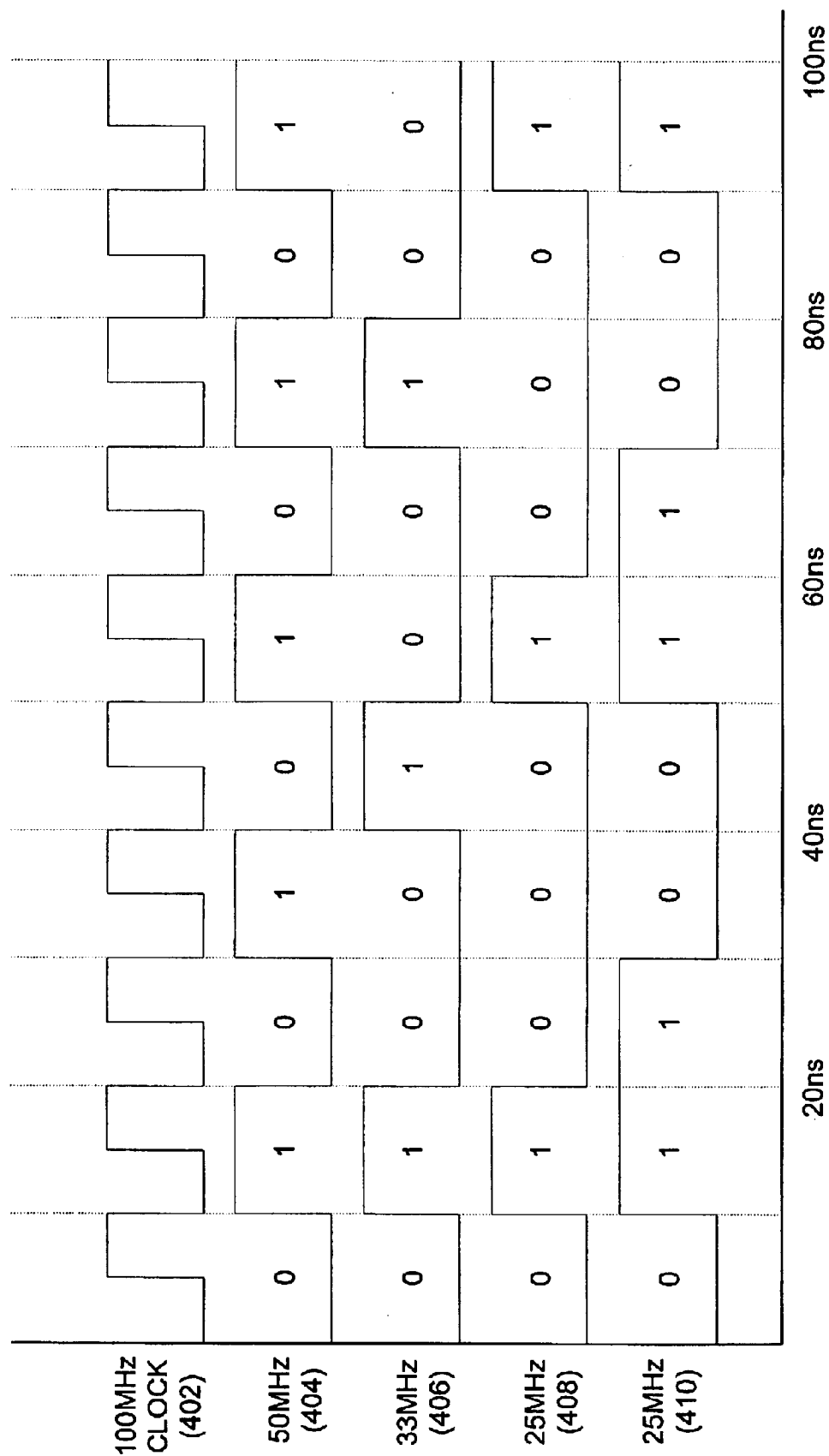
FIG. 4 shows a graph of I/O bit patterns in accordance with an embodiment of the present invention.

FIG. 4 shows several exemplary bit patterns based on a 100 MHz clock frequency that may excite a circuit at frequencies other than 100 MHz. The clock signal (402) is shown on the top line of the graph in FIG. 4. Transmitted data bits in the clock's system, for example, are sent every 10 nanoseconds (at 5 ns, 15 ns, 25 ns, etc. in FIG. 4). The data is held steady during the positive transition clock edges.

The second line (404) on the graph in FIG. 4 shows an alternating bit pattern: "0101010101." If a binary one is sent every other clock cycle, energy is input to the system every other clock cycle, for a resulting frequency of 50 MHz. The third line (406) on the graph in FIG. 4 shows the bit pattern: "0100100100," inputting energy every third clock cycle. With the bit pattern, energy is input to the system at 33 MHz. The fourth line (408) on the graph in FIG. 4 shows a bit pattern with a binary one every fourth clock cycle, inputting energy at 25 MHz. The fifth signal (410) on the graph in FIG. 4 shows a different 25 MHz signal. The bit pattern is "0011," and the bit pattern duty cycle is 50%. Bit patterns with a 50% duty cycle have the strongest effect in inciting power supply resonance. If any of the frequencies generated by a particular bit pattern matches the power supply resonance frequency of the IC, the IC may malfunction.

Data to be transmitted between integrated circuits passes through high power transmission amplifiers before being transmitted from one integrated circuit to another. These signals are greatly amplified on an integrated circuit and may have a relatively large effect on a power distribution network. If a frequency of data transmitted between integrated circuits occurs at a power supply resonance frequency, the power distribution network may excite the power supply impedance spike described above. Accordingly, integrated circuits connected to the power distribution network may be current-starved and may malfunction. Data transmitted between integrated circuits is a significant contributor to switching-induced power supply resonance.

Figure 1:
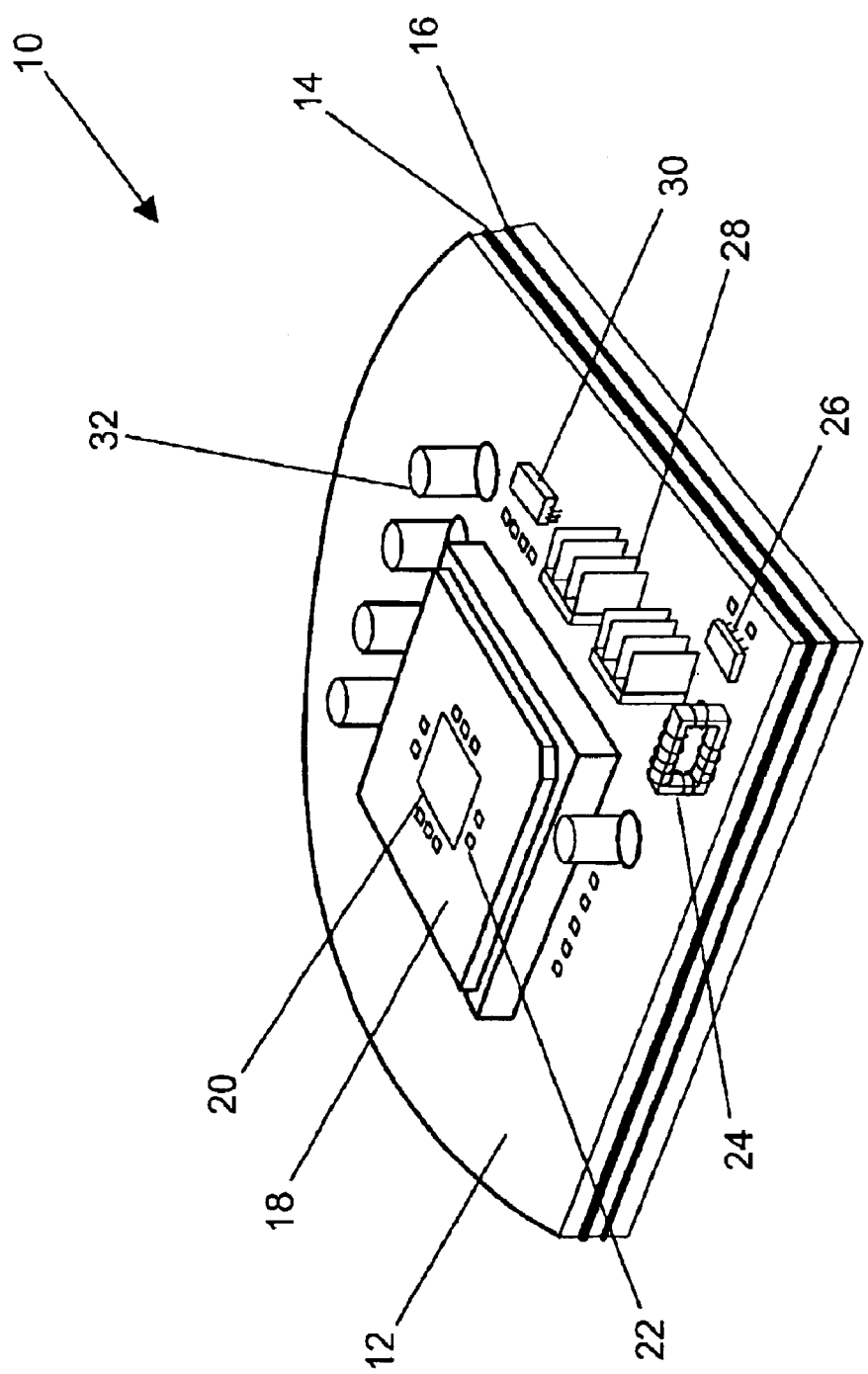
FIG. 1 shows a prior art integrated circuit system.
Figure 2:
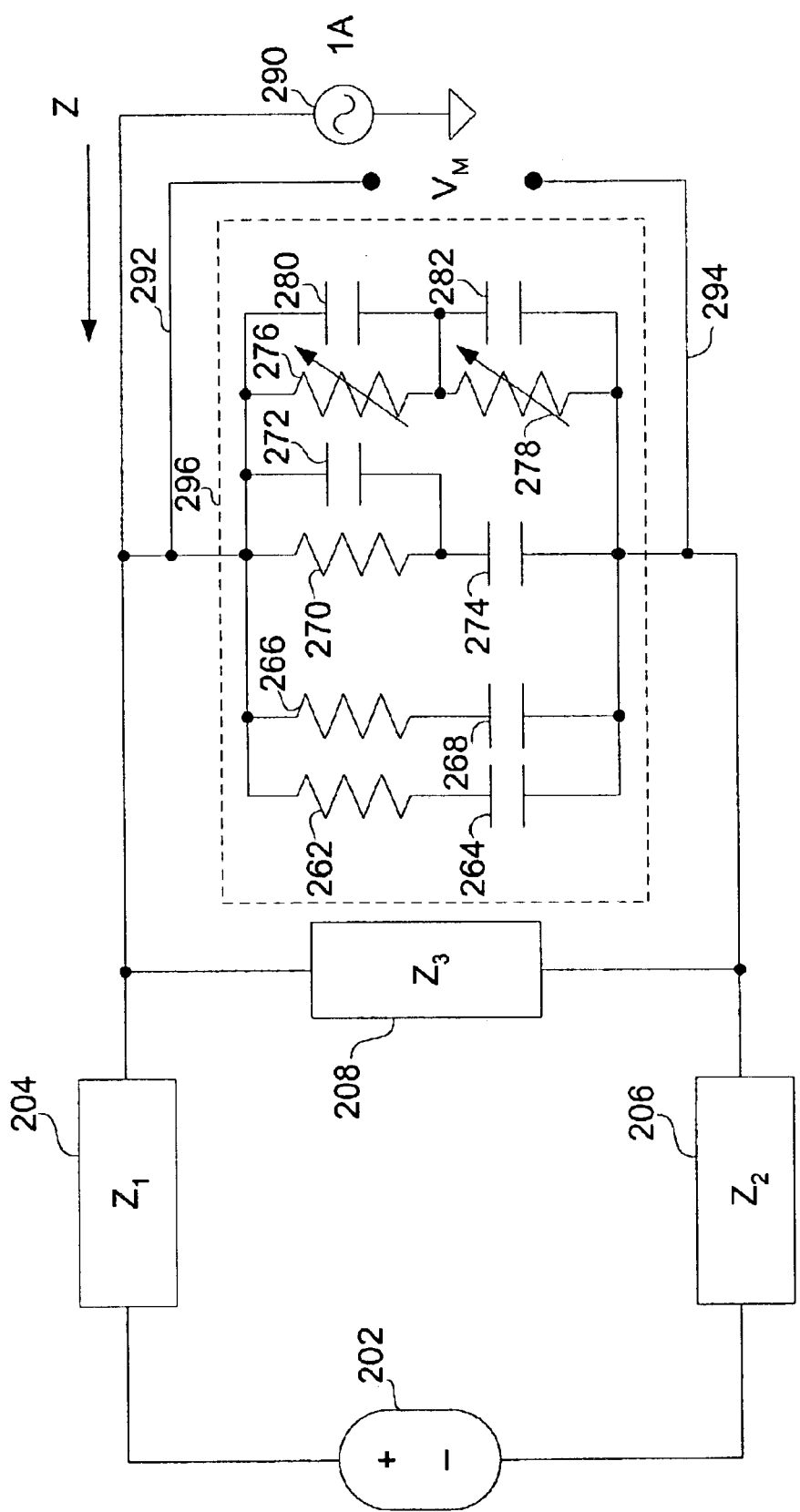
FIG. 2 shows a schematic of a power distribution network for an integrated circuit.
Figure 5:
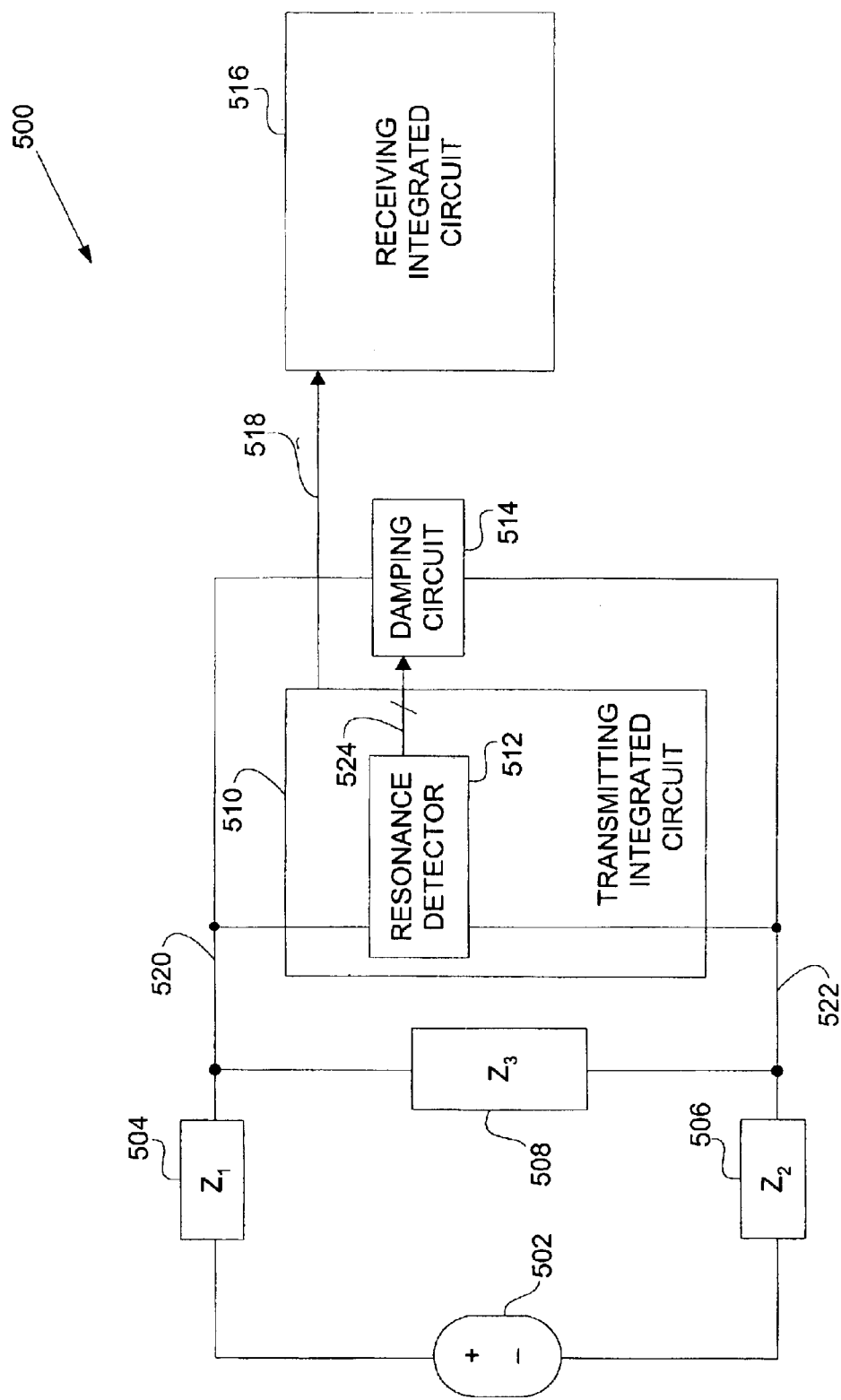
FIG. 5 shows a block diagram of a power supply resonance compensation system in accordance with an embodiment of the present invention.

FIG. 5 shows a block diagram of an exemplary power supply resonance compensation system (500) in accordance with an embodiment of the present invention. In FIG. 5, a transmitting IC (510) is connected to a power supply (502) with two power supply lines (520, 522). The transmitting IC (510) transmits data to a receiving IC (516) on line (518). The parasitic impedances $Z_1$ (504), $Z_2$ (506), and $Z_3$ (508) (204, 206, and 208, respectively, shown in FIG. 2) are shown.

Embodiments of the present invention use a damping circuit (514) that does not reside on the transmitting IC (510) to dampen a power supply resonance. A resonance detector (512) determines when the damping circuit (514) should be activated. The resonance detector (512) uses line(s) (524) to control the damping circuit (514). Under non-resonant conditions, the damping circuit (514) approximates an open circuit, thereby dissipating no power when power supply resonance damping is not needed. The resonance detector (512) may monitor transmissions between the integrated circuits (510, 516) on line (518) and determine whether a transmission will cause a power supply resonance condition. If the transmission is determined to cause a power supply resonance condition, the resonance detector (512) will activate the damping circuit (514) so that the damping circuit (514) may damp the power supply resonance.

Furthermore, the resonance detector (512) may be arranged to detect a voltage potential sag of a voltage potential on at least one of the power supply lines (520, 522). Accordingly, if the voltage potential sag is detected, the resonance detector (512) will activate the damping circuit (514) so that the damping circuit (514) may damp the power supply resonance (which may cause the voltage potential sag). One of ordinary skill in the art understands that a threshold may be set such that the voltage potential sag must cross the threshold to activate the damping circuit (514).

According to one or more embodiments of the present invention, the resonance detector (512) may store a list of bit patterns known to cause power supply resonance. Transmissions monitored by the resonance detector (512) would be compared to the list of offending bit patterns. Upon discovery of such a pattern, the resonance detector (512) enables the damping circuit (514) to dampen the impending power supply resonance caused by the offending bit pattern.

Because the first bit of an offending bit pattern may come at any time in a series of bits, a shift register may be used as part of the pattern detecting system. The bits to be transmitted may be fed through the shift register so that the pattern being transmitted could be "moved" and compared with respect to the offending bit pattern. If at any time during the transmitted pattern's traversal of the shift register, the transmitted pattern matches the offending bit pattern, the resonance detector (512) has detected an offensive bit pattern.

According to one or more embodiments of the present invention, the resonance detector (512) may perform a frequency analysis on the transmitted data signal. A frequency analysis algorithm may be used to determine the frequency content of the signal. Fourier analysis (e.g., Fast Fourier Transform) or wavelet analysis may be used to determine the frequency content of the signal. After determining the power supply resonance frequency of an integrated circuit and power distribution network combination, frequencies generated by offending bit patterns are programmed into the resonance detector (512). During operation, bit patterns are transformed into the frequency domain, and the resonance detector (512) in turn looks for frequency content near the power supply resonance frequency. The damping circuit (514) may be activated if the signal contains enough energy near the power supply resonance frequency to induce power supply resonance.

Signal frequency content near harmonics of the power supply resonance frequency (i.e., frequencies that are integer multiples of the power supply resonance frequency) may also cause power supply resonance. In one or more embodiments, a frequency analysis-based resonance detector may be programmed to be responsive to harmonic frequencies of the power supply resonance frequency as well as the power supply resonance frequency itself.

In FIG. 5, the resonance detector (512) is shown as a part of the transmitting IC (510). One of ordinary skill in the art will understand that the resonance detector (512) may also be included as a part of the receiving IC (516), or the resonance detector (512) may be included on a third IC (not shown) separate from the transmitting IC (510) and the receiving IC (516). The resonance detector (512) may also be a separate IC on the package of either the transmitting IC (510) or the receiving IC (516).

Figure 6:
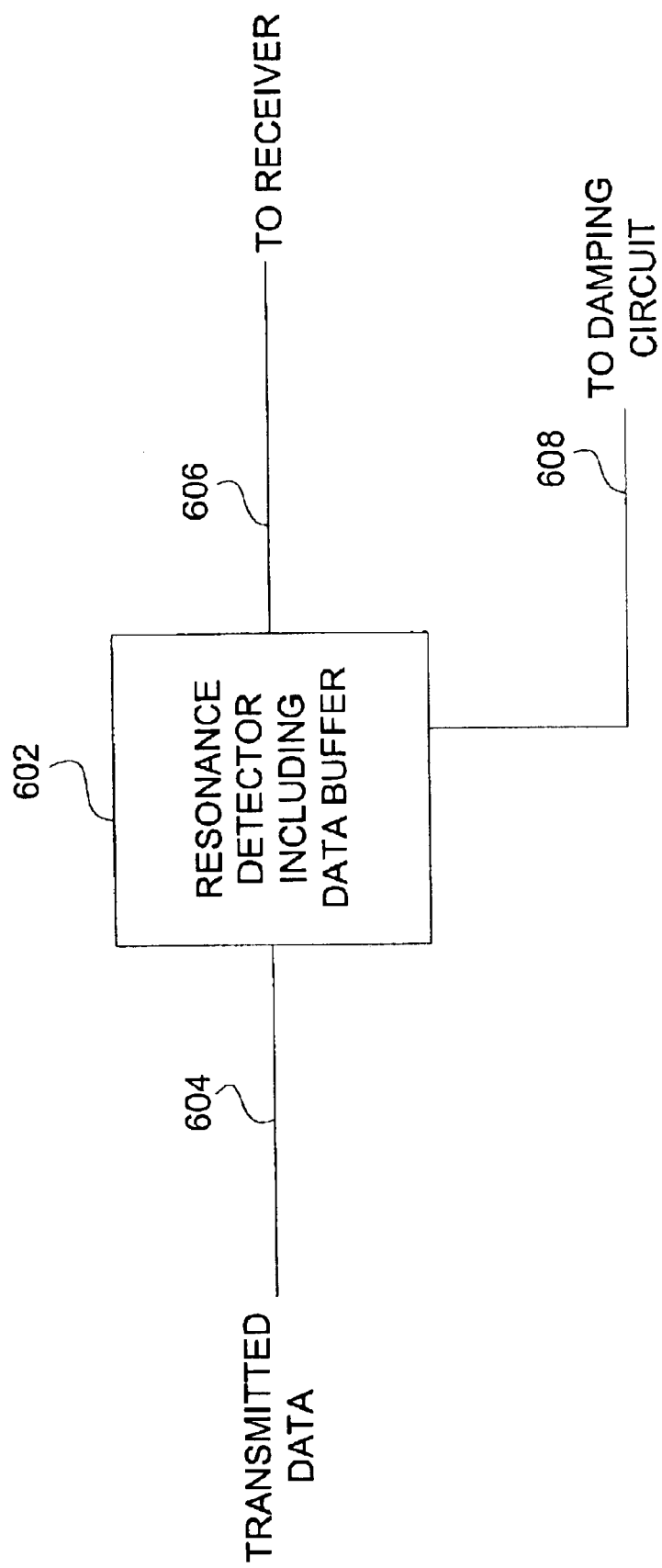
FIG. 6 shows a block diagram of a resonance detector system in accordance with an embodiment of the present invention.

FIG. 6 shows a block diagram of an exemplary resonance detector system in accordance with an embodiment of the present invention. Data transmitted on line (604) is sent to the resonance detector (602). The resonance detector (602) includes a data buffer that latches the transmitted data for analysis. The transmitted data is then passed on to the intended receiver on line (606). If the resonance detector (602) determines that a transmission will cause power supply resonance, the resonance detector (602) activates the damping circuit (not shown) using line (608). Data, for the purposes of the present invention, includes any information that may be transmitted between at least two integrated circuits.

Figure 7:
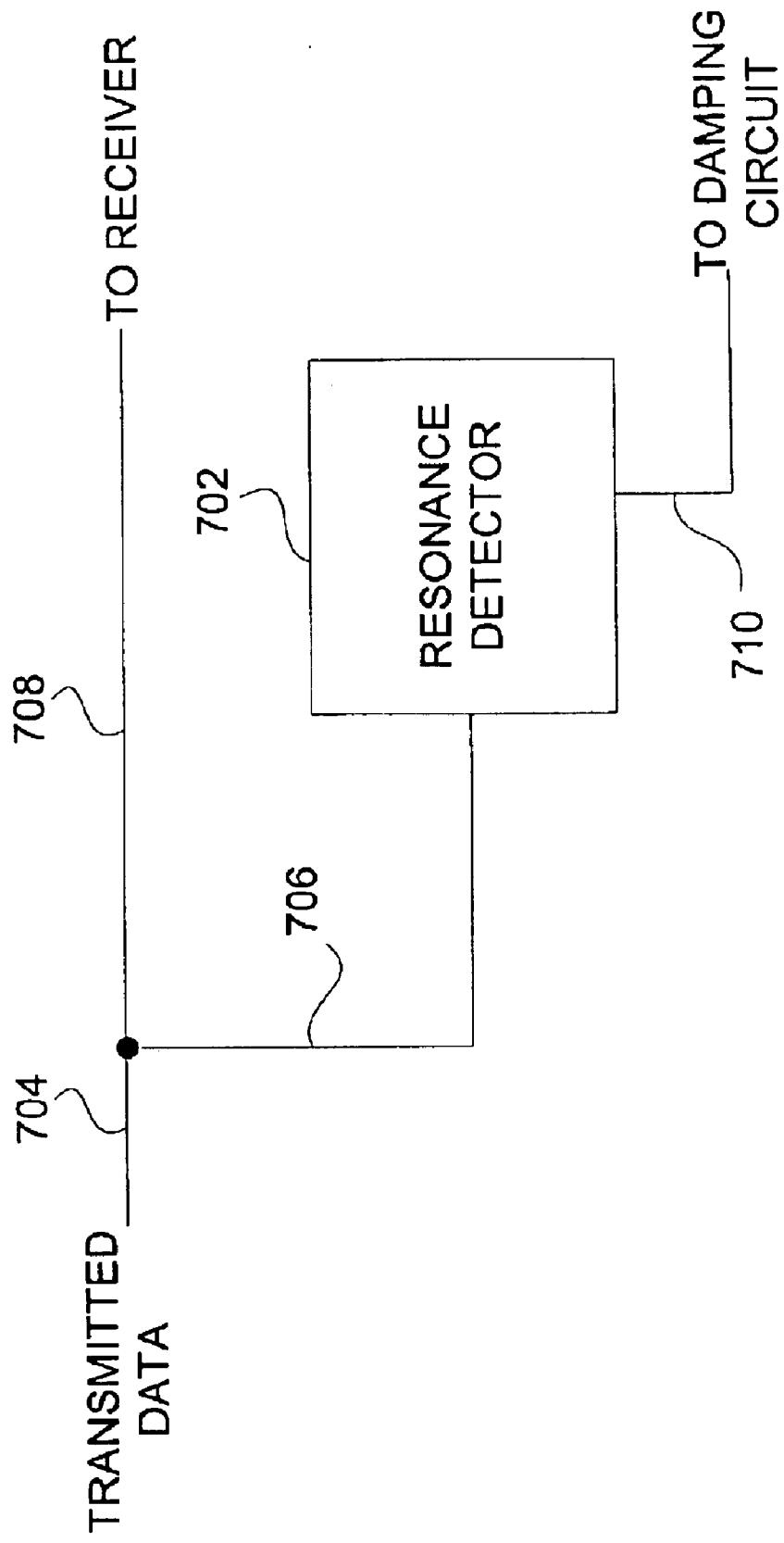
FIG. 7 shows a block diagram of a resonance detector system in accordance with an embodiment of the present invention.

One of ordinary skill in the art will understand that other configurations are possible. FIG. 7 shows a block diagram of an exemplary resonance detector system in accordance with an embodiment of the present invention. The resonance detector (702) may monitor transmissions between integrated circuits without being disposed between a transmitter (not shown) and a receiver (not shown) as in FIG. 6. One of ordinary skill in the art will understand that lines (704), (706), and (708) represent the same electrical node. Data to be transmitted is sent on line (704), which splits into lines (706) and (708). Line (708) continues to carry the data on to the intended receiver, while line (706) supplies the data to the resonance detector (702). If the resonance detector (702) determines that a transmission will cause power supply resonance, the resonance detector (702) activates the damping circuit (not shown) using line (710).

Figure 8:
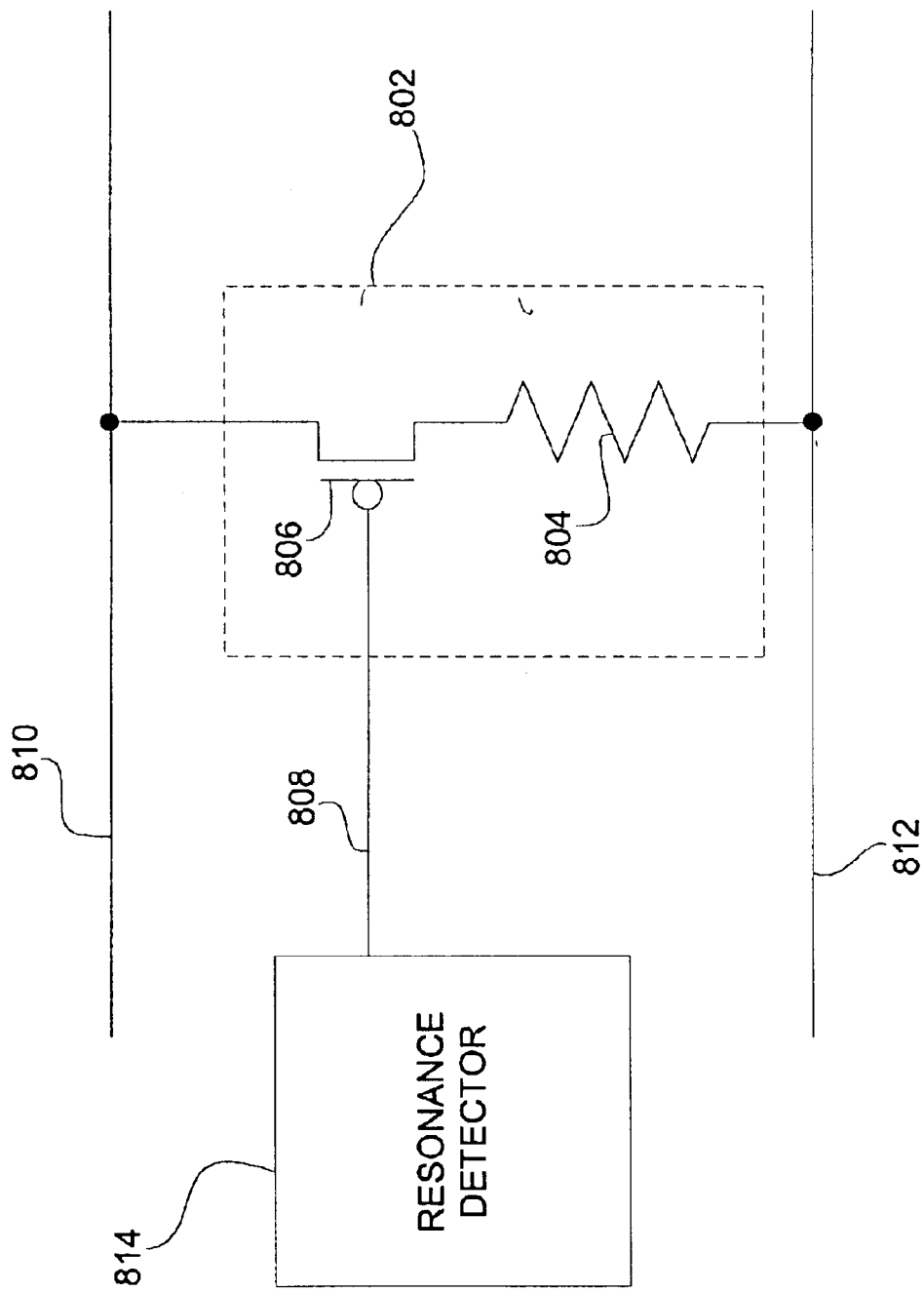
FIG. 8 shows a schematic of a resonance detector and damping circuit in accordance with an embodiment of the present invention.

As shown in FIG. 8, according to an embodiment of the present invention, an exemplary damping circuit (802) may be a resistor (804) in series with a PMOS transistor (806) operating as a switch. A resonance detector (814) supplies a high voltage potential to the gate of the transistor under power supply non-resonant conditions, so that the damping circuit (802) is essentially an open circuit. When a power supply resonance inducing event is detected, the resonance detector (814) supplies a low voltage potential to the transistor (806) using line (808), causing the transistor (806) to behave as a short circuit, thereby creating a resistance between power supply lines (810, 812). The resistor (804) between the power supply lines (810, 812) will dampen the power supply resonance. When the power supply resonance-inducing event is over or damping is no longer required, the resonance detector (814) will turn "off" the transistor (806).

One of ordinary skill in the art will understand that an NMOS transistor could also be used instead of the PMOS transistor (806). The NMOS transistor may connect to power supply line (812) an in series with the resistor (804) connected to power supply line (810). The resonance detector (814) applies a high voltage potential to the gate of the NMOS transistor while a power supply resonance inducing event is detected.

Those skilled in the art will note that the control scheme used for a switch-mode operation is called "bang-bang control" because the control signal "bangs" between two discrete values (i.e., ON and OFF) as some parameter (e.g., frequency of transmitted bits, or voltage potential sag of at least one power supply line) enters and leaves an appropriate operating range (e.g., near power supply resonance, or voltage potential difference from an expected value).

Figure 9:
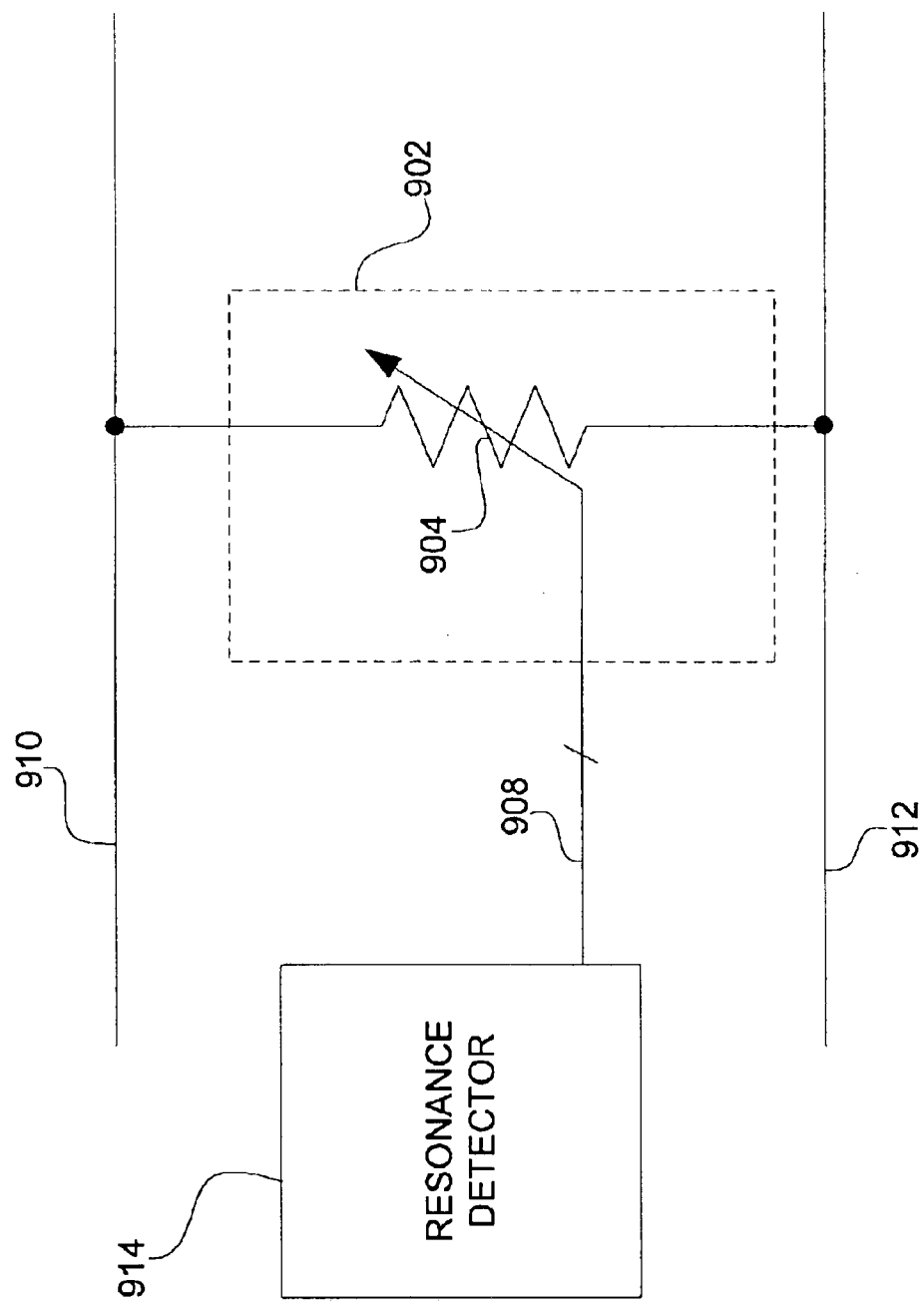
FIG. 9 shows a schematic of a resonance detector and damping circuit in accordance with an embodiment of the present invention.

As shown in FIG. 9, according to an embodiment of the present invention, a damping circuit (902) may be a digital potentiometer (904) under control of a resonance detector (914). The resonance detector (914) sends control information on line(s) (908) to the digital potentiometer (904) that controls the resistance between the two power supply lines (910, 912). For proper operation under power supply non-resonant conditions, the digital potentiometer (904) may be set to a very high resistance so that the digital potentiometer (904) may act as an open circuit.

The digital potentiometer (904) is tunable and may be continuously variable. If the resonance detector (914) detects a condition that may cause a small power supply resonance, the resonance detector (914) may respond appropriately by setting the digital potentiometer (904) to a slightly lower value than the digital potentiometer's (904) open circuit mode. Accordingly, the power supply resonance is effectively damped while the damping circuit (902) dissipates as little power as necessary. If the resonance detector (914) detects an event that will induce a relatively large power supply resonance, the resonance detector (914) may set the digital potentiometer (904) to relatively low resistance value to dampen the power supply resonance.

In one or more embodiments, various different control schemes may be used to control the damping circuit (902).

Proportional, integral, differential (PID) control is one control method that could be employed by the resonance detector (914). The resonance detector's (914) PID parameters may be selected to optimize at least one aspect of the system's performance. Depending on the application, the goal of the optimization may be to minimize the amplitude of a power supply resonance, to minimize the duration of a power supply resonance, or to minimize power dissipated by the damping circuit.

One of ordinary skill in the art will understand that there are many other potential embodiments of a damping circuit. The minimum requirements are that the damping circuit be controllable by a resonance detector, and that the damping circuit be able to dampen a power supply resonance. In one or more embodiments, the power supply resonance is dampened by lowering a power supply impedance.

Figure 10:
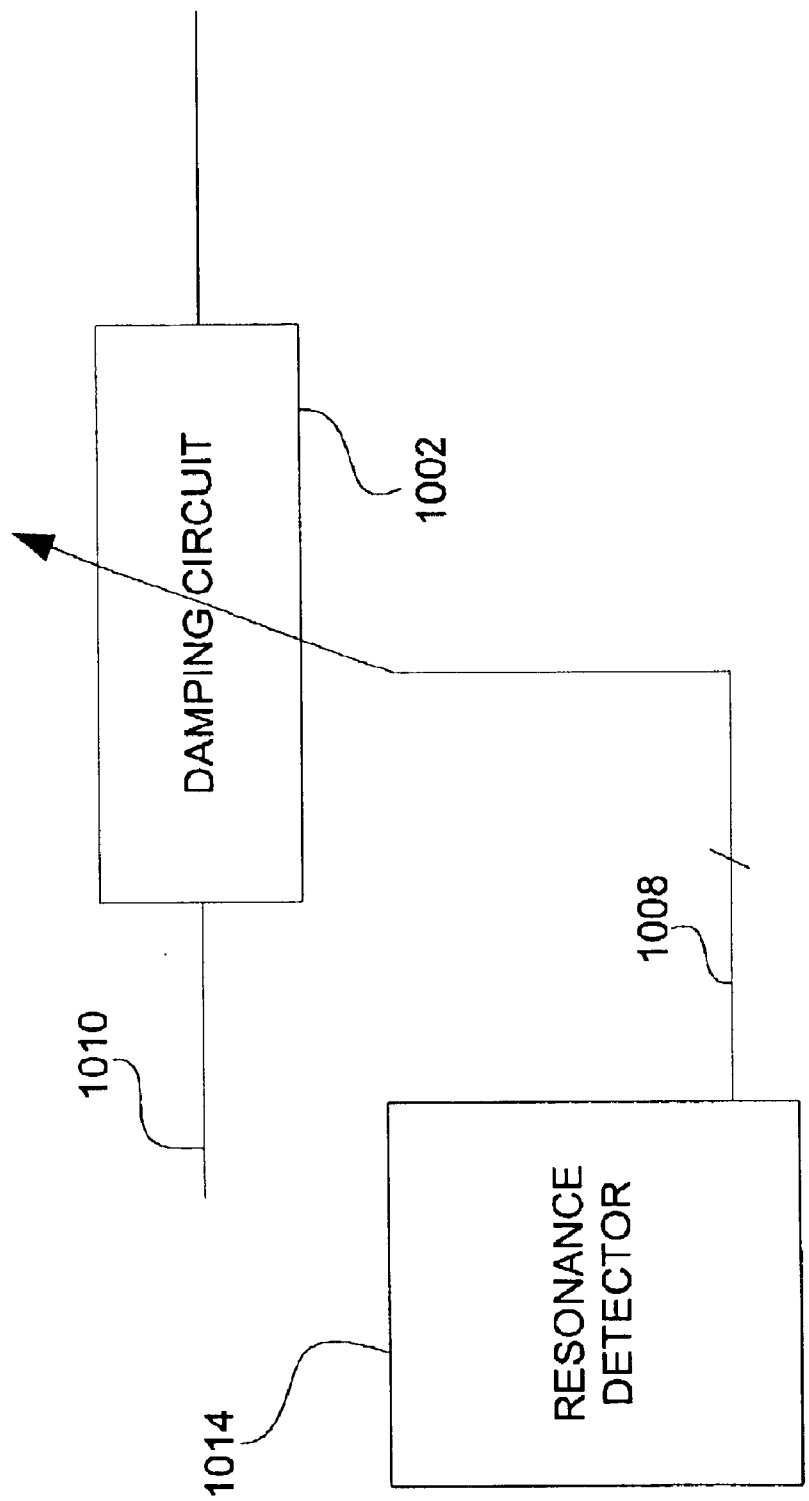
FIG. 10 shows a schematic of a resonance detector and damping circuit in accordance with an embodiment of the present invention.

As shown in FIG. 10, according to an embodiment of the present invention, a damping circuit (1002) may be under control of a resonance detector (1014). The resonance detector (1014) sends control information on line(s) (1008) to the damping circuit (1002) that controls the impedance on power supply line (1010). For proper operation under power supply non-resonant conditions, the damping circuit (1002) may be set to a very low impedance.

The damping circuit (1002) is tunable and may be continuously variable. If the resonance detector (1014) detects a condition that may cause a small power supply resonance, the resonance detector (1014) may respond appropriately by setting the damping circuit (1002) to a slightly higher impedance value. Accordingly, the power supply resonance is effectively damped while the damping circuit (1002) dissipates as little power as necessary. If the resonance detector (1014) detects an event that will induce a relatively large power supply resonance, the resonance detector (1014) may set the damping circuit (1002) to relatively high impedance value to dampen the power supply resonance.

In one or more embodiments, various different control schemes may be used to control the damping circuit (1002). PID control is one control method that could be employed by the resonance detector (1014). The resonance detector's (1014) PID parameters may be selected to optimize at least one aspect of the system's performance. Depending on the application, the goal of the optimization may be to minimize the amplitude of a power supply resonance, to minimize the duration of a power supply resonance, or to minimize power dissipated by the damping circuit.

One of ordinary skill in the art will understand that there are many potential embodiments of a damping circuit. The minimum requirements are that the damping circuit be controllable by a resonance detector, and that the damping circuit be able to dampen a power supply resonance. In one or more embodiments, the power supply resonance is dampened by increasing a power supply impedance.

Figure 3:
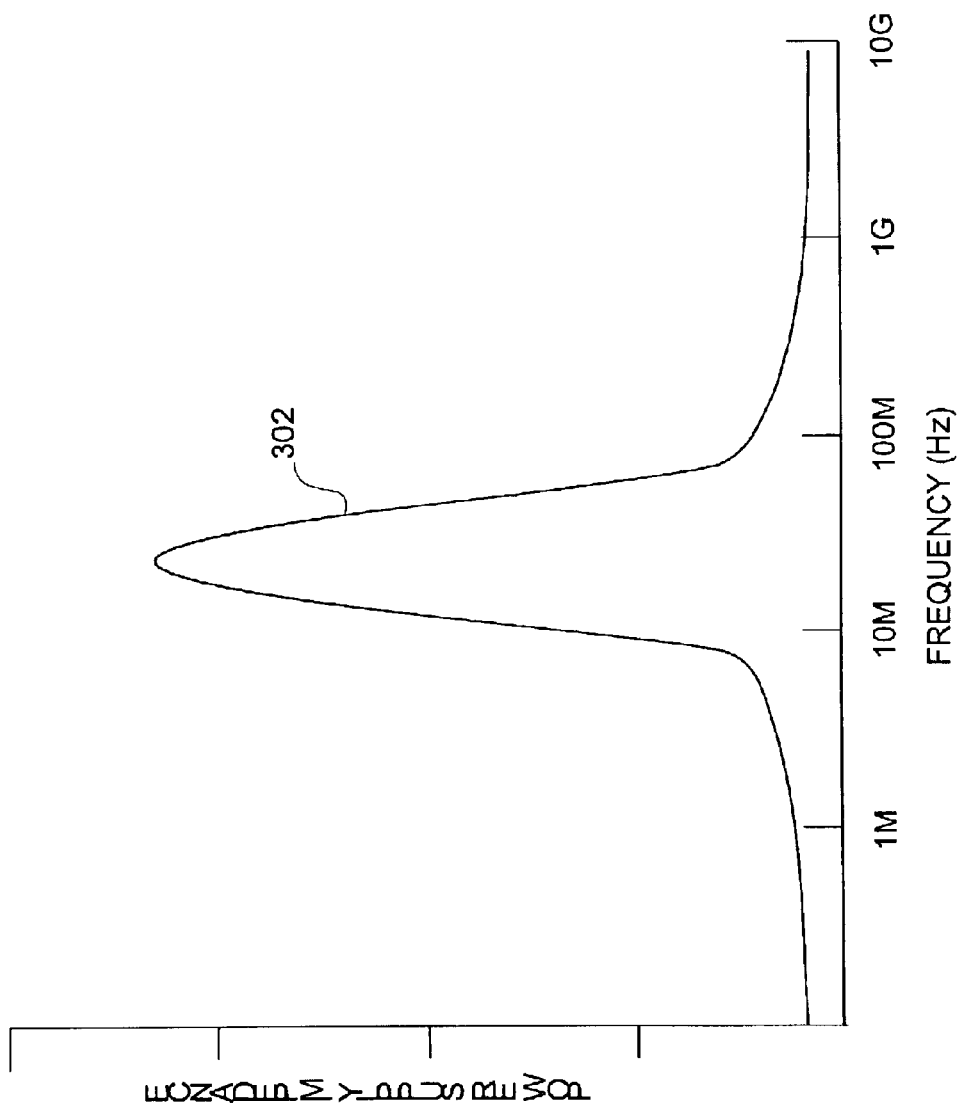
FIG. 3 shows a graph depicting power supply system impedance.
Figure 11:
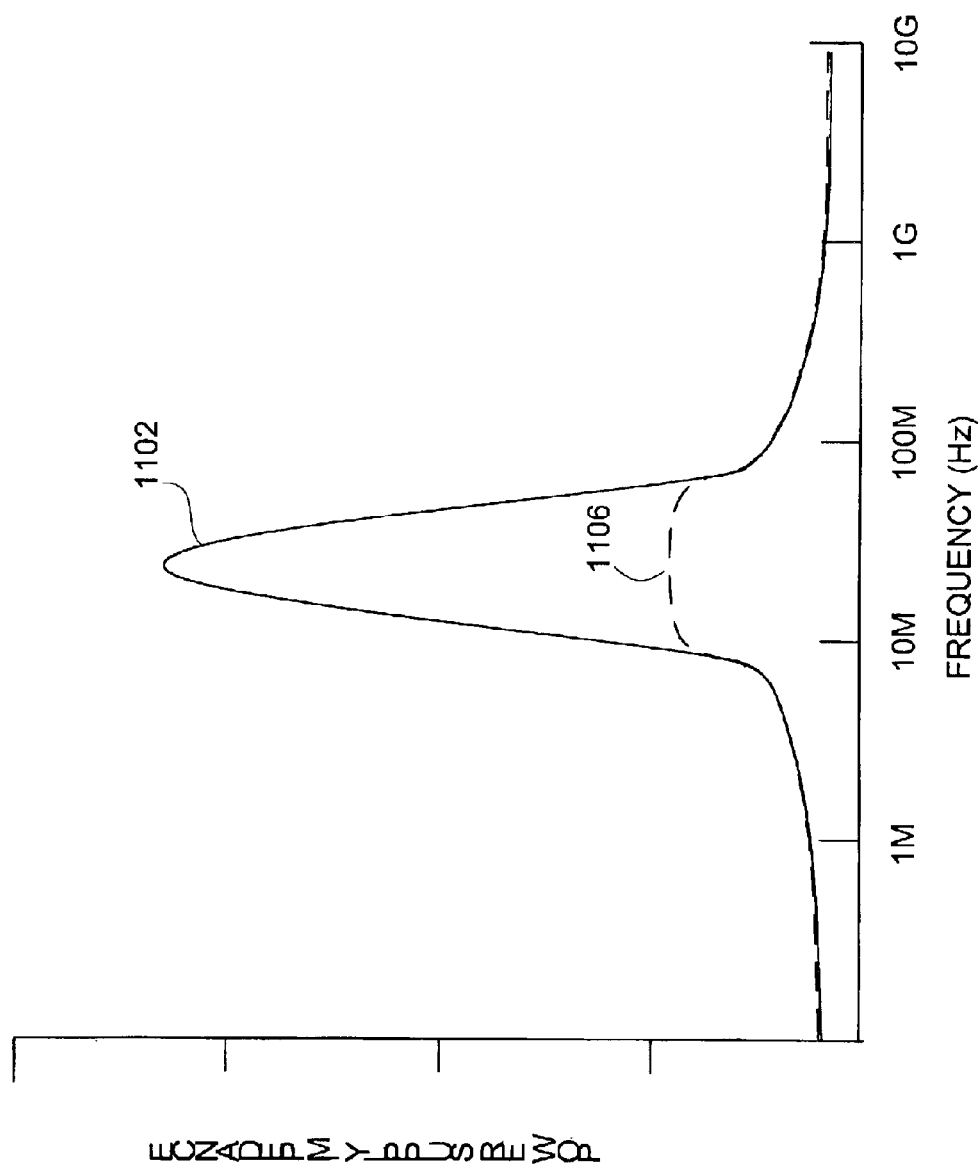
FIG. 11 shows a graph depicting power supply system impedance in accordance with an embodiment of the present invention.

FIG. 11 shows a graph depicting an exemplary power supply system impedance in accordance with an embodiment of the present invention. A power supply impedance curve (1102) displays a power supply impedance without the influence of the present invention as shown in the power supply impedance curve (302) in FIG. 3. Power supply impedance curve (1106) shows a relationship of impedance to frequency under the influence of the present invention. Away from the power supply resonance frequency, the two power supply impedance curves (1102, 1106) are approximately equivalent. Accordingly, a damping circuit is an open circuit at these frequencies. In other words, at such power supply non-resonant frequencies, the damping circuit, e.g., damping circuit (802 in FIG. 8), has no effect on the power distribution network. Near the power supply resonance frequency, the resonance detector activates the damping circuit, e.g., damping circuit (802 in FIG. 8), and the power supply resonance is attenuated.

Advantages of the present invention may include one or more of the following. In one or more embodiments, the present invention may dampen a power supply resonance in a power distribution network, thereby improving system performance.

In one or more embodiments, the present invention may limit the amount of power dissipated by the damping circuit while still effectively damping power supply resonance.

In one or more embodiments, the present invention may allow control over how a power supply resonance is damped. Amplitude of the power supply resonance, duration of the power supply resonance, or power dissipated by the damping circuit may be minimized.

Some power supply resonance-inducing transmissions may occur unpredictably. In one or more embodiments, the present invention may detect such power supply resonance-inducing transmissions, and the resulting power supply resonance may be damped. In one or more embodiments, the present invention may detect a voltage potential sag on at least one power supply line and damp a power supply resonance.

In one or more embodiments, the present invention's damping circuit will only dissipate power when a power supply resonance exists and requires damping, thereby dissipating power only when needed.

In one or more embodiments, a damping circuit may not be close to other circuits; therefore, heat produced/dissipated by damping may not affect the other circuits. A separate component used for the damping circuit may be less expensive to implement.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A power supply resonance compensation system, comprising:

a power distribution network arranged to propagate from a power supply at least one voltage potential to an integrated circuit;

a resonance detector operatively connected to the at least one voltage potential and arranged to detect power supply resonance; and a damping circuit external to the integrated circuit operatively connected to the resonance detector and the power distribution network, wherein the damping circuit is arranged to dampen the power supply resonance under control of the resonance detector.

2. The power supply resonance compensation system of claim 1, wherein the resonance detector is arranged to detect a transmission from the integrated circuit to a receiving circuit, wherein the transmission causes the power supply resonance.

3. The power supply resonance compensation system of claim 2, wherein the resonance detector is operatively connected between the integrated circuit and the receiving circuit.

4. The power supply resonance compensation system of claim 2, wherein the resonance detector comprises a transmission buffer that stores data before the data is transmitted to receiving circuit.

5. The power supply resonance compensation system of claim 1, wherein the resonance detector is responsive to a voltage potential sag of the at least one voltage potential.

6. The power supply resonance compensation system of claim 1, wherein the resonance detector is disposed on at least one selected from the group consisting of the integrated circuit, a package of the integrated circuit, and a separate resonance detecting device.

7. The power supply resonance compensation system of claim 1, wherein the resonance detector is arranged to compare a transmitted bit pattern to at least one stored bit pattern, wherein the at least one stored bit pattern is representative of a bit pattern that causes the power supply resonance.

8. The power supply resonance compensation system of claim 7, wherein the resonance detector is arranged to use a shift register to detect when the transmitted bit pattern matches the at least one stored bit pattern.

9. The power supply resonance compensation system of claim 1, wherein the resonance detector is arranged to use frequency analysis to detect when a transmitted bit pattern matches at least one stored frequency.

10. The power supply resonance compensation system of claim 1, wherein the resonance detector is responsive to a harmonic frequency of a power supply resonance frequency of the power distribution network.

11. The power supply resonance compensation system of claim 1, wherein the damping circuit is at least one selected from the group consisting of an analog circuit, a switch, and a potentiometer.

12. The power supply resonance compensation system of claim 1, wherein the resonance detector is arranged to control the damping circuit in a manner selected from the group consisting of bang-bang control, proportional control, integral control, differential control, and proportional, integral, differential control.

13. A method for reducing power supply resonance, comprising:

propagating at least one voltage potential from a power supply to an integrated circuit;

transmitting data to a receiving circuit from the integrated circuit;

detecting whether a particular level of power supply resonance exists; and damping the power supply resonance dependent on the detecting, wherein the damping occurs external to the integrated circuit.

14. The method of claim 13, wherein the detecting comprises detecting the transmitting for a transmission that causes power supply resonance.

15. The method of claim 13, wherein the detecting comprise detecting a voltage potential sag of the at least one voltage potential 16. The method of claim 13, wherein the detecting comprises comparing a bit pattern of the transmission to at least one bit pattern known to cause the power supply resonance.

17. The method of claim 13, wherein the detecting comprises frequency analyzing a bit pattern of the transmission.

18. The method of claim 13, wherein the detecting comprises detecting a harmonic frequency of a power supply resonance frequency.

19. The method of claim 13, wherein the detecting comprises analyzing data stored in a transmission buffer.

20. An apparatus for reducing power supply resonance, comprising:

power distribution means for propagating power to an integrated circuit;

means for detecting power supply resonance on the power distribution means; and means for damping power supply resonance under control of the means for detecting, wherein the means for damping resides external to the integrated circuit.

* * * * *